United States Patent
Ghyselen

(10) Patent No.: US 11,744,153 B2
(45) Date of Patent: Aug. 29, 2023

(54) METHOD FOR PRODUCING A LAYER BY THINNING AND ION PENETRATION

(71) Applicant: Soitec, Bernin (FR)

(72) Inventor: Bruno Ghyselen, Seyssinet (FR)

(73) Assignee: Soitec, Bernin (FR)

( * ) Notice: Subject to any disclaimer, the term of this patent is extended or adjusted under 35 U.S.C. 154(b) by 1204 days.

(21) Appl. No.: 16/304,063

(22) PCT Filed: May 24, 2017

(86) PCT No.: PCT/FR2017/051291
§ 371 (c)(1),
(2) Date: Nov. 21, 2018

(87) PCT Pub. No.: WO2017/203174
PCT Pub. Date: Nov. 30, 2017

(65) Prior Publication Data
US 2020/0259069 A1  Aug. 13, 2020

(30) Foreign Application Priority Data

May 25, 2016 (FR) ..................................... 1654685

(51) Int. Cl.
*H01L 41/253* (2013.01)
*H01L 41/187* (2006.01)
(Continued)

(52) U.S. Cl.
CPC ........... *H10N 30/04* (2023.02); *H10N 30/072* (2023.02); *H10N 30/8542* (2023.02)

(58) Field of Classification Search
CPC .. H01L 41/253; H01L 41/312; H01L 41/1873
(Continued)

(56) References Cited

U.S. PATENT DOCUMENTS 4,551,647 A * 11/1985 Day .................... B06B 1/0651
29/25.35
8,189,981 B2 * 5/2012 Muller ................... G02F 1/225
385/131
(Continued)

FOREIGN PATENT DOCUMENTS

CN  101258591 B  4/2011
CN  102318055 B  4/2014
(Continued)

OTHER PUBLICATIONS

Steichen et al., Acoutic Components Used for Filtering-Models and Simulation Tools, https://www.techniques-ingenieur.fr/base-documentaire/electronique-photonique-th13/materiaux-pour-l-electronique-et-dispositifs-associes-42271210/composantsacoustiques-utilises-pour-le-filtrage-e2001, (Nov. 10, 2010), abstract only.
(Continued)

*Primary Examiner* — Shawki S Ismail
*Assistant Examiner* — Monica Mata
(74) *Attorney, Agent, or Firm* — TraskBritt

(57) ABSTRACT

A method for producing a layer of composition $AA'BO_3$, wherein A consists of at least one element selected from the group consisting of: Li, Na, K, Ca, Mg, Ba, Sr, Pb, La, Bi, Y, Dy, Gd, Tb, Ce, Pr, Nd, Sm, Eu, Ho, Zr, Sc, Ag and Tl, and B consists of at least one element selected from the group consisting of: Nb, Ta, Sb, Ti, Zr, Sn, Ru, Fe, V, Sc, C, Ga, Al, Si, Mn, Zr and Tl, is described. The method includes providing a donor substrate of composition $ABO_3$, forming a layer of composition $ABO_3$ by thinning the donor substrate, and exposing the layer of composition $ABO_3$ to a medium containing ions of an element A' belonging to the same list of elements as A, A' being different from A, such that the ions penetrate into the layer of composition $ABO_3$ to form the layer of composition $AA'BO_3$.

22 Claims, 3 Drawing Sheets

(51) Int. Cl.
  *H01L 41/312* (2013.01)
  *H10N 30/04* (2023.01)
  *H10N 30/072* (2023.01)
  *H10N 30/853* (2023.01)

(58) Field of Classification Search
  USPC ........................................................ 29/25.35
  See application file for complete search history.

(56) References Cited

U.S. PATENT DOCUMENTS

| | | | |
|---|---|---|---|
| 2003/0199105 | A1 | 10/2003 | Kub et al. |
| 2006/0060900 | A1* | 3/2006 | Zhang ................. C04B 35/4682 257/295 |
| 2010/0088868 | A1 | 4/2010 | Kando |
| 2011/0316937 | A1 | 12/2011 | Arakawa et al. |
| 2016/0065162 | A1* | 3/2016 | Zinke ....................... H03H 3/08 310/313 C |

FOREIGN PATENT DOCUMENTS

| | | |
|---|---|---|
| JP | 05-306123 A | 11/1993 |
| JP | 2006-225203 A | 8/2006 |

OTHER PUBLICATIONS

Korkishko et al., Reverse Proton Exchange for Buried Waveguides in LinbO3, J. Opt. Soc. Am. A, vol. 15, No. 7, (Jul. 1998), 6 pages.
International Written Opinion for International Application No. PCT/FR2017/051291 dated Oct. 23, 2017, 4 pages.
International Search Report for International Application No. PCT/FR2017/051291 dated Oct. 23, 2017, 3 pages.
Korean Notice of Non-Final Rejection for Aplication No. 10-2018-7037431 dated Jan. 24, 2022, 3 pages.
Chinese Office Action for Chinese Application No. 201780032163.X dated Aug. 30, 3033, 7 pages.

\* cited by examiner

METHOD FOR PRODUCING A LAYER BY THINNING AND ION PENETRATION

CROSS-REFERENCE TO RELATED APPLICATIONS

This application is a national phase entry under 35 U.S.C. § 371 of International Patent Application PCT/FR2017/051291, filed May 24, 2017, designating the United States of America and published as International Patent Publication WO 2017/203174 A1 on Nov. 30, 2017, which claims the benefit under Article 8 of the Patent Cooperation Treaty to French Patent Application Serial No. 1654685, filed May 25, 2016.

TECHNICAL FIELD

The present disclosure relates to a method for producing a layer of composition $AA'BO_3$ where A and A' consist of at least one element selected from: Li, Na, K, Ca, Mg, Ba, Sr, Pb, La, Bi, Y, Dy, Gd, Tb, Ce, Pr, Nd, Sm, Eu, Ho, Zr, Sc, Ag, Tl and B consists of at least one element selected from: Nb, Ta, Sb, Ti, Zr, Sn, Ru, Fe, V, Sc, C, Ga, Al, Si, Mn, Zr, Tl, notably piezoelectric, in particular, for an application to a microelectronic, photonic or optic device. In particular, but in a non-limiting manner, the device may be a surface acoustic wave device or a bulk acoustic wave device for radiofrequency applications.

BACKGROUND

Among acoustic components used for filtering in the radiofrequency domain, two main categories of filters may be distinguished:
  on the one hand, surface acoustic wave (SAW) filters;
  on the other hand, bulk acoustic wave (BAW) filters and resonators.

For a review of these technologies, reference may be made to the article of W. Steichen and S. Ballandras, "Composants acoustiques utilisés pour le filtrage—Revue des différentes technologies," Techniques de l'Ingénieur, E2000, 2008.

Surface acoustic wave filters typically comprise a thick piezoelectric layer (that is to say, of thickness generally of several hundreds of µm) and two electrodes in the form of two interdigitated metal combs deposited on the surface of the piezoelectric layer. An electrical signal, typically a variation in electrical voltage, applied to an electrode is converted into an elastic wave that propagates on the surface of the piezoelectric layer. The propagation of this elastic wave is favored if the frequency of the wave corresponds to the frequency range of the filter. This wave is again converted into an electrical signal on reaching the other electrode.

Bulk acoustic wave filters for their part typically comprise a thin piezoelectric layer (that is to say of thickness generally much less than 1 µm) and two electrodes arranged on each main face of the thin layer. An electrical signal, typically a variation in electrical voltage, applied to an electrode is converted into an elastic wave that propagates through the piezoelectric layer. The propagation of this elastic wave is favored if the frequency of the wave corresponds to the frequency range of the filter. This wave is again converted into an electrical voltage on reaching the electrode situated on the opposite face.

In the case of surface acoustic wave filters, the piezoelectric layer has to have an excellent crystalline quality so as not to cause attenuation of the surface wave. Thus, a monocrystalline layer will be preferred in this case. At the present time, suitable materials that can be used industrially are quartz, $LiNbO_3$ or $LiTaO_3$. The piezoelectric layer is obtained by cutting from an ingot of one of the materials, the precision required for the thickness of the layer not being very important in so far as the waves have to propagate essentially on its surface.

In the case of bulk acoustic wave filters, the piezoelectric layer must have a determined thickness that is uniform over the whole of the layer, and must be so in a precisely controlled manner. On the other hand, crystalline quality, hence, passing to the second order of parameters of importance for the performances of the filter, compromises are presently made on the crystalline quality of the layer and a polycrystalline layer has for a long time been considered as acceptable. The piezoelectric layer is thus formed by deposition on a support substrate (for example, a silicon substrate). At the present time, the materials employed industrially for such a deposition are AlN, ZnO and $Pb(Zr_x,Ti_{1-x})O_3$ (PZT).

The choices of materials are thus very limited in both technologies.

Yet, the choice of a material results from a compromise between different properties of the filter, as a function of the specifications of the manufacturer of the filter. In particular, the electromechanical coupling coefficient of the piezoelectric materials are criteria of choice of the material to use for a given application and a given component architecture.

For example, $LiNbO_3$ and $LiTaO_3$ are highly anisotropic materials. The coupling coefficient depending on the crystalline orientation, the choice of a particular orientation of the material offers a first degree of freedom in the choice of the material. This is the reason why substrates can be found according to a multiplicity of crystalline orientations, for example: X-cut, Y-cut, Z-cut, YZ-cut, 36° rotated Y axis, 42° rotated Y axis, etc.

However, apart from the possibility of selecting a particular crystalline orientation, those skilled in the art only have at their disposal quartz, $LiNbO_3$ and $LiTaO_3$ for designing a surface acoustic wave filter, which only offers a limited range of parameters for optimizing the characteristics of the filter, even if several other materials could complete this list in the future such as langasite $La_3Ga_5SiO_{14}$, for example.

In order to offer more freedom in the dimensioning of bulk acoustic wave filters or surface acoustic wave filters, it would be desirable to be able to use more materials than the materials listed above, without moreover adversely affecting the quality of the materials.

BRIEF SUMMARY

One aim of the present disclosure is to overcome the aforesaid drawbacks and notably to conceive a method for producing a monocrystalline layer, notably piezoelectric, in particular, for a surface acoustic wave device, made of other materials than the materials used for this application, in particular, by making it possible to obtain layers that are thin (that is to say, of thickness less than 20 µm, or even less than 1 µm) and uniform of the materials used for surface acoustic wave devices. Moreover, this method must also make it possible to use a greater variety of support substrates than in existing bulk acoustic wave devices.

In accordance with the disclosure, a method is described for producing a layer of composition $AA'BO_3$ where A consists of at least one element selected from: Li, Na, K, Ca, Mg, Ba, Sr, Pb, La, Bi, Y, Dy, Gd, Tb, Ce, Pr, Nd, Sm, Eu, Ho, Zr, Sc, Ag, Tl and B consists of at least one element selected from: Nb, Ta, Sb, Ti, Zr, Sn, Ru, Fe, V, Sc, C, Ga, Al, Si, Mn, Zr, Tl, wherein the method comprises:

providing a donor substrate of composition $ABO_3$, forming a layer of composition $ABO_3$ by thinning the donor substrate, before and/or after the thinning step, exposing the layer of composition $ABO_3$ to a medium containing ions of an element A' belonging to the same list of elements as A, A' being different from A, such that the ions penetrate into the layer to form a layer of composition $AA'BO_3$.

"Donor substrate of composition $ABO_3$" is taken to mean a substrate entirely consisting of $ABO_3$ or comprising at least one layer of this material and in which may be formed, by thinning of the substrate, a layer of composition $ABO_3$ intended to be converted into the layer of composition $AA'BO_3$.

In the case where A consists of two or more elements, by extension "element A" designates all of the elements constituting A. In this case, the expression "A' is different from A" signifies that the element A' is different from each of the elements constituting A.

In a particularly advantageous manner, the ions of the element A' penetrate into the layer by an ion exchange mechanism.

According to one embodiment, the medium containing the ions of the element A' is a liquid and the layer is immersed in a bath of the liquid.

For example, the layer of composition $ABO_3$ may be immersed in a bath comprising an acid solution of a salt comprising the element A'.

According to another embodiment, the medium containing the ions of the element A' is in gaseous phase and the layer is exposed to the gas.

According to one embodiment, the ions of the element A' penetrate into the layer by implantation and a heat treatment may be implemented to make the ions diffuse into the layer.

According to another embodiment, the medium containing the ions of the element A' is in solid phase, a layer of the medium being deposited on the layer of composition $ABO_3$.

Advantageously, the method comprises at least one annealing step to favor the diffusion of the element A' from the medium to the layer of composition $ABO_3$.

According to one embodiment of the disclosure, the layer of composition $ABO_3$ is monocrystalline.

According to one embodiment, the thinning of the donor substrate comprises the application of a receiver substrate on the donor substrate, the layer of composition $ABO_3$ being at the interface, and the transfer of the layer onto the receiver substrate.

The application of the receiver substrate may comprise the deposition of the substrate on the donor substrate.

Alternatively, the application of the receiver substrate comprises the bonding of the substrate on the donor substrate.

The thickness of the layer transferred onto the receiver substrate is advantageously less than 20 µm.

According to one particular embodiment, at least one electrically insulating layer and/or at least one electrically conducting layer is formed at the interface between the receiver substrate and the layer.

According to one embodiment, the thickness of the layer of composition $ABO_3$ is greater than 2 µm, preferably greater than 20 µm, the layer being self-supporting at the end of the thinning of the donor substrate.

The thinning of the donor substrate may comprise the following steps:

the formation of a weakened zone in the donor substrate so as to delineate the layer of composition $ABO_3$, the detachment from the donor substrate along the weakened zone.

The weakened zone is advantageously formed by ion implantation in the donor substrate.

According to a particular embodiment, the element A is lithium and the element A' is sodium and/or potassium. The element B may then be advantageously niobium and/or tantalum.

The disclosure also relates to a method for producing a bulk acoustic wave device comprising forming electrodes on two opposite main faces of a piezoelectric layer, wherein the method comprises the production of the piezoelectric layer by a method as described above.

The disclosure also relates to a method for producing a surface acoustic wave device, comprising the formation of two interdigitated electrodes on the surface of a piezoelectric layer, wherein the method comprises the production of the piezoelectric layer by a method as described above.

BRIEF DESCRIPTION OF THE DRAWINGS

Other characteristics and advantages of the disclosure will become clear from the detailed description that follows, with reference to the accompanying drawings, in which.

For reasons of legibility of the figures, the elements illustrated are not necessarily represented to scale. Furthermore, elements designated by the same reference signs in different figures are identical.

DETAILED DESCRIPTION

Generally speaking, a layer of composition $ABO_3$ is formed by thinning a donor substrate of composition $ABO_3$. Thinning may be carried out by any appropriate technique, among which may be cited the SMART CUT® method, thanks to which is formed, by implantation of ionic species in the donor substrate, a weakened zone delineating the layer of interest; any other technique of formation of the weakened zone being able to be employed; or instead the implementation of one or more steps of etching the donor substrate so as to conserve only the layer of interest.

If the layer is sufficiently thick, it may be self-supporting, that is to say that it does not need to be applied on a stiffener substrate in order to have sufficient mechanical strength.

Alternatively, notably if the layer is thin, the thinning of the donor substrate is preceded by a step of applying, on the donor substrate, a receiver substrate. The application of the receiver substrate may be done notably by bonding or by deposition on the donor substrate.

From the layer of composition $ABO_3$ thereby obtained, a layer of more complex composition of $AA'BO_3$ type is obtained, in which A' belongs to the same list of elements as A but is different from A. Obtaining such a layer assumes exposing the layer of composition $ABO_3$ to a medium comprising ions of the element A', so as to make at least one part of the ions penetrate into the layer.

The conversion of the layer of initial composition $ABO_3$ into a layer of composition $AA'BO_3$ advantageously involves an ion exchange mechanism that is used in the glass field. For example, it is known to replace a part of the Na+ ions present in certain glasses by Ag+ or K+ ions, by implementing a treatment consisting in immersing the glass in a bath of molten salts, for example, $AgNO_3$ or $KNO_3$, respectively. Similarly, the disclosed method may be implemented by exposing the layer to convert into a layer of more complex composition to a medium containing ions of the element A' with which it is wished to enrich the layer, the medium being able to be liquid (for example, a bath of an acid solution of a salt comprising the element A'), gaseous or solid.

Figure 1A:
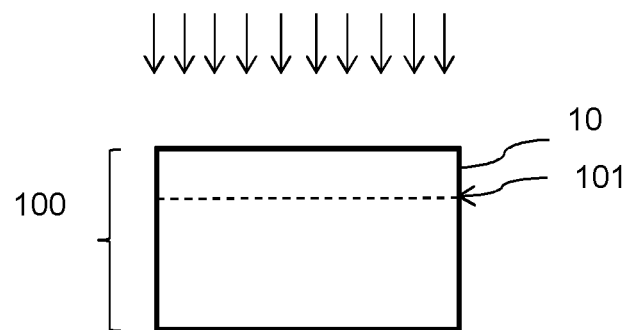
FIGS. 1A to 1F schematically illustrate the steps of the method for producing a monocrystalline layer of composition $AA'BO_3$ according to one embodiment of the disclosure.
Figure 1B:
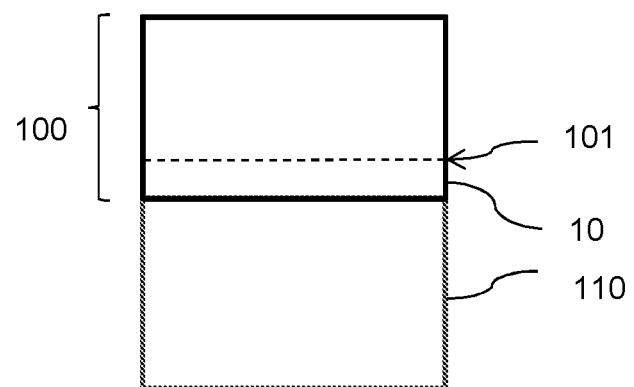
Figure 1C:
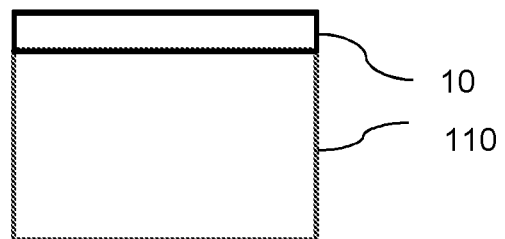

With reference to FIGS. 1A to 1D, a method is considered for producing a layer of composition $AA'BO_3$ according to one embodiment implementing the SMART CUT® method, comprising the following steps:

providing a donor substrate of composition $ABO_3$, the formation of a weakened zone 101 by implantation of ionic species (for example, hydrogen and/or helium) in the donor substrate 100 so as to delineate the layer 10 to transfer (cf. FIG. 1A), the application of a receiver substrate 110 on the donor substrate 100, the layer 10 to transfer being at the interface (cf. FIG. 1B), the detachment from the donor substrate 100 along the weakened zone 101 so as to transfer the layer 10 onto the receiver substrate 110 (cf. FIG. 1C).

In an alternative (not illustrated) to the SMART CUT® method, the transfer of the layer 10 onto the receiver substrate may be carried out by thinning the donor substrate 100 by its face opposite to the bonding interface, down to the layer 10 to transfer. This thinning may involve at least one etching, chemical mechanical polishing and/or another appropriate technique.

The donor substrate may be a bulk substrate of the considered material. Alternatively, the donor substrate may be a composite substrate, that is to say formed of a stack of at least two layers of different materials, of which a superficial layer consists of the considered material.

Among piezoelectric materials of particular interest are perovskites and comparable materials, of $ABO_3$ structure. However, the interest that can be placed in these materials is not limited to their piezoelectric character. Notably for other applications, for example, linked to integrated optics, interest could also be taken in them if need be for their dielectric permittivity, for their refractive indices, or instead for their pyroelectric, ferroelectric or instead ferromagnetic properties, for example, and depending on the case. Several large families stand out. One of them derives notably from binary materials such as $LiNbO_3$, $LiTaO_3$, $KNbO_3$, $KTaO_3$ to end up with a generic formula of $ABO_3$ type where A consists of one or more of the following elements: Li, Na, K and where B consists of one or more of the following elements: Nb, Ta, Sb, V. Another large family derives from $SrTiO_3$, $CaTiO_3$, $SrTiO_3$, $PbTiO_3$, $PbZrO_3$ materials notably to end up with a generic formula of $ABO_3$ type where A consists of one or more of the following elements: Ba, Ca, Sr, Mg, Pb, La, Y and where B consists of one or more of the following elements: Ti, Zr, Sn. Other less widespread families may also be derived from $BiFeO_3$, or instead $LaMnO_3$, $BaMnO_3$, $SrMnO_3$, or instead $LaAlO_3$, or instead, $LiAlO_3$, $LiGaO_3$, or instead $CaSiO_3$, $FeSiO_3$, $MgSiO_3$, or instead $DyScO_3$, $GdScO_3$ and $TbScO_3$.

In the end, it could be summarized by considering that A consists of one or more of the following elements selected from: Li, Na, K, Ca, Mg, Ba, Sr, Pb, La, Bi, Y, Dy, Gd, Tb, Ce, Pr, Nd, Sm, Eu, Ho, Zr, Sc, Ag, Tl and B consists of one or more of the following elements selected from: Nb, Ta, Sb, Ti, Zr, Sn, Ru, Fe, V, Sc, C, Ga, Al, Si, Mn, Zr, Tl.

Some of these materials are monocrystalline; others are not monocrystalline.

The crystalline nature and the composition of the donor substrate are selected by those skilled in the art depending on the destination of the layer to transfer.

The receiver substrate has a function of mechanical support of the transferred layer. It may be of any nature and, advantageously but not imperatively, adapted to the targeted application, the transferred layer optionally being able to be transferred later onto another substrate. The receiver substrate may be bulk or composite.

According to one embodiment, the application of the receiver substrate on the donor substrate is carried out by bonding.

Alternatively, the application of the receiver substrate on the donor substrate is carried out by a deposition of the receiver substrate on the donor substrate. Any suitable deposition technique, such as, for example, but in a non-limiting manner, an evaporation, a cathodic sputtering, an aerosol sputtering, a chemical phase deposition, an electrodeposition, a spread coating, a spin coating, a varnishing, a screen printing, an immersion, may be used. Such a solution is particularly advantageous to compensate for poor adhesion of the donor substrate vis-à-vis the receiver substrate.

Optionally, the method comprises forming at least one electrically insulating layer and/or at least one electrically conducting layer (not represented) at the interface between the receiver substrate 110 and the layer 10 to transfer.

In the case where the layer 10 is sufficiently thick to confer thereon a certain mechanical strength, notably during the operation of detachment along the weakened zone or during its later use, the step of application of the receiver substrate may be omitted. The layer 10 is then called self-supporting after its detachment from the rest of the donor substrate. In this case, the thickness of the layer 10 is typically greater than 2 µm, preferably greater than 20 µm, and the energy of implantation of the ionic species is greater than 1 MeV.

Whether the layer 10 of initial composition $ABO_3$ is self-supporting or transferred onto the receiver substrate 110, it is next converted into a layer of composition $AA'BO_3$ where A' is an element belonging to the same list as A but is different than element A.

Figure 1D:
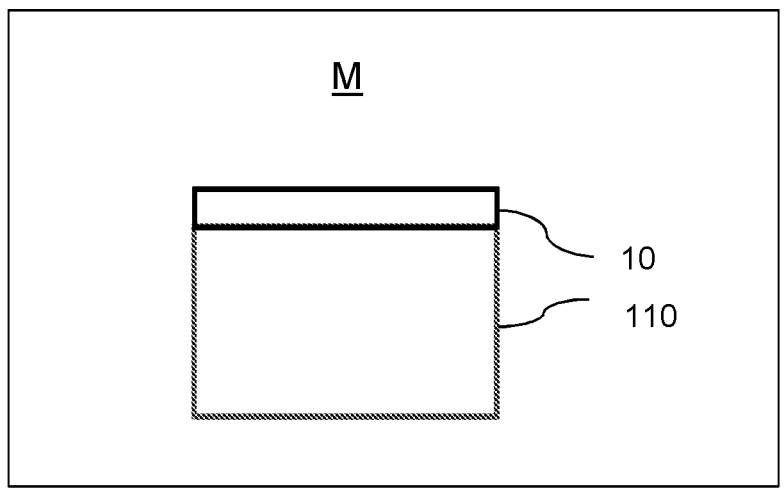

This modification of the composition of the transferred layer 10 is carried out by exposing the layer (and optionally the whole of the receiver substrate that supports it) to a medium M comprising ions of the element A' (cf. FIG. 1D).

This exposure has the effect of making ions of the element A' migrate from the medium M to the transferred layer 10, thereby enriching the transferred layer with element A'.

Optionally, atoms of the element A situated in the layer 10 can migrate to the medium M.

Similarly, if obtaining the layer 10 requires the implementation of an implantation of H+ ions, of hydrogen atoms present in the transferred layer at the location of atoms of the element A, the hydrogen atoms can migrate to the medium M. A reverse proton exchange type mechanism is brought into play in this migration. Reverse proton exchange is described, in relation with an entirely other application than that addressed by the present disclosure, in the article of Yu.

N. Korkishko et al. entitled "Reverse proton exchange for buried waveguides in LiNbO$_3$," J. Opt. Soc. Am. A, Vol. 15, No. 7, July 1998.

According to one embodiment, the layer 10 is exposed to the medium M before the step of thinning the donor substrate and thus has a composition AA'BO$_3$ before being transferred onto the receiver substrate or be formed as a self-supporting layer, if need be.

Optionally, the exposure to the medium M may be implemented both before and after the thinning of the donor substrate.

Furthermore, different elements A' may be inserted into the layer 10, by successively exposing the layer to different media each comprising ions of the element A'. It is thus possible to obtain a layer 10 having a complex composition with several elements of the list to which the element A belongs.

An ion exchange type mechanism is brought into play in the migration of ions of the element A' into the layer of initial composition ABO$_3$.

The medium M may be a liquid, in which case, the transferred layer is immersed in a bath of the liquid.

Alternatively, the medium M may be gaseous, in which case, the transferred layer is placed in an enclosure containing the gas.

Those skilled in the art are able to define the operating conditions of this exposure, notably the composition of the medium, the duration and the temperature of exposure, as a function of the desired composition of the layer.

Figure 1E:
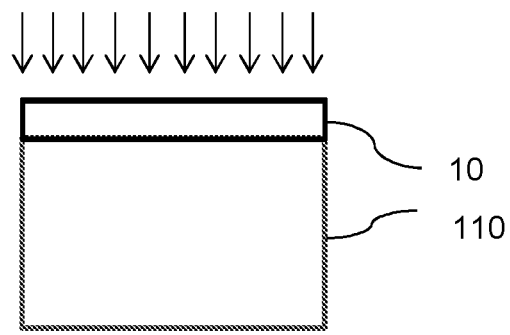

According to one particular embodiment, illustrated in FIG. 1E, the exposure to the medium may be carried out by implantation of ions of the element A' into the transferred layer (this implantation is shown schematically by arrows). Since the implantation results in a peak of ions implanted at a determined depth of the layer, it must be followed by a heat treatment intended to cause a diffusion of the ions into the whole of the thickness of the layer, in order to homogenize the composition thereof. Such an annealing also makes it possible to repair crystalline defects created by the implantation. This annealing is generally carried out immediately after the implantation. In certain cases, it starts during the implantation step itself, notably when the substrate subjected to the implantation heats up under the exposure of the corresponding energy flux. But the annealing can also take place later in the sequencing of steps of methods. It is thereby possible to intercalate other steps between the implantation step and the annealing step, such as, for example, the lift-off of a superficial passivation layer, or instead a polishing step, an etching step or instead a layer transfer operation. The annealing may moreover be carried out in several stages, which can be spread out over different steps of the overall method. The implantation may be of conventional type, that is to say, in which the ions are transported in the form of a beam of ions accelerated to a certain energy (typically several tens to several hundreds of keV). In an alternative, the implantation may be carried out by plasma immersion, which makes it possible to implant rapidly a high dose of A' ions in the vicinity of the surface of the transferred layer. These techniques are known to those skilled in the art.

Figure 1F:
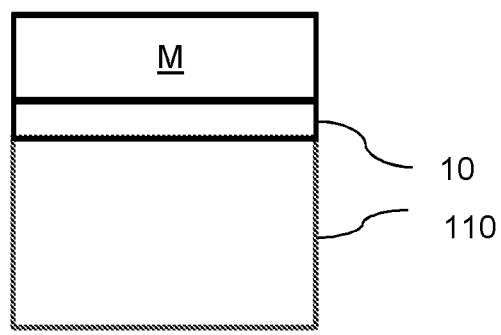

According to another alternative, the medium M may be in solid phase, and the transferred layer 10 is exposed to the medium by deposition of a layer of the medium on the layer 10 (cf. FIG. 1F). "On" is here taken to mean either directly in contact with the layer 10, or through one or more layers formed of different materials, in so far as the intermediate layers do not block the migration of the element A from the layer constituting the medium M to the layer 10. A better penetration of the ions of the element A into the layer 10 is made possible by one or more annealing steps. The deposited layer containing the element A may be removed at the end of the operation, optionally between two successive annealing steps.

In the remainder of the text a layer of initial composition LiXO$_3$, where X is niobium and/or tantalum, is taken as example. In other words, in this non-limiting example, the element A is lithium and the element B is niobium and/or tantalum, it being understood that those skilled in the art are able to define suitable conditions for the other materials cited above.

To transform the layer of initial composition LiXO$_3$ into a layer of composition LiKXO$_3$ or LiNaXO$_3$, the layer is exposed to an acid solution of a potassium or sodium salt.

Those skilled in the art are able to define the operating conditions of this exposure, notably the composition of the medium, the duration and the temperature of exposure, as a function of the composition targeted for the transferred layer.

Optionally, before the step of enrichment with element A', a part of the thickness of the layer transferred onto the receiver substrate is removed. This removal may be carried out by chemical mechanical polishing, by etching or by any other appropriate technique.

Two applications of the layer 10 of composition modified according to the disclosed method are described hereafter.

Figure 2:
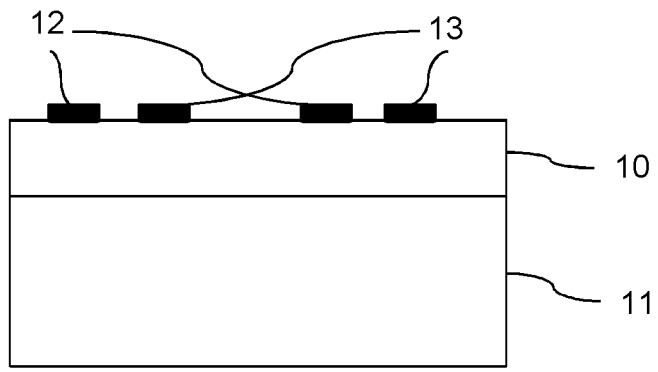
FIG. 2 is a cross-sectional principal view of a surface acoustic wave filter.

FIG. 2 is a principal view of a surface acoustic wave filter.

The filter comprises a piezoelectric layer 10 and two electrodes 12, 13 in the form of two interdigitated metal combs deposited on the surface of the piezoelectric layer. On the side opposite to the electrodes 12, 13, the piezoelectric layer rests on a support substrate 11. The piezoelectric layer 10 is monocrystalline, an excellent crystalline quality indeed being necessary so as not to cause attenuation of the surface wave.

Figure 3:
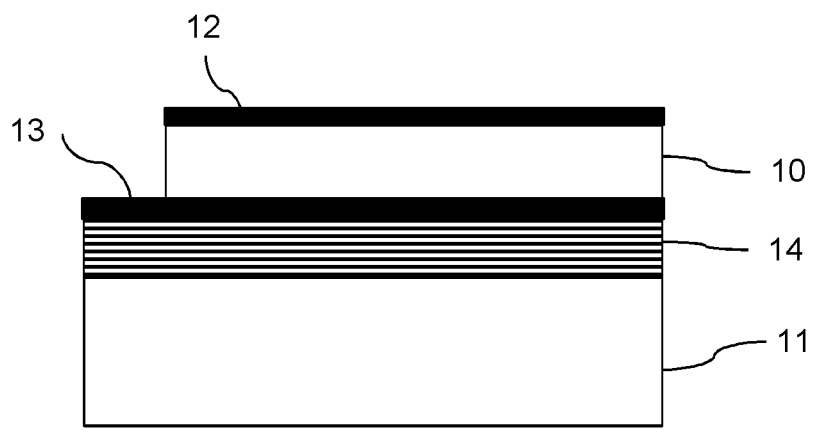
FIG. 3 is a cross-sectional principal view of a bulk acoustic wave filter.

FIG. 3 is a principal view of a bulk acoustic wave resonator.

The resonator comprises a thin piezoelectric layer (that is to say of thickness generally less than 1 μm, preferably less than 0.2 μm) and two electrodes 12, 13 arranged on either side of the piezoelectric layer 10. The piezoelectric layer 10 rests on a support substrate 11. To insulate the resonator from the substrate and thereby avoid the propagation of waves in the substrate, a Bragg mirror 14 is interposed between the electrode 13 and the substrate 11. Alternatively (not illustrated), this insulation could be achieved by arranging a cavity between the substrate and the piezoelectric layer. These different arrangements are known to those skilled in the art and thus will not be described in detail in the present text.

In certain cases, the receiver substrate may not be optimal for the final application. It may then be advantageous to transfer the layer 10 onto a final substrate (not represented) of which the properties are selected as a function of the targeted application, by bonding it on the final substrate and by removing the receiver substrate by any suitable technique.

In the case where it is wished to produce a surface acoustic wave device, metal electrodes 12, 13 in the form of two interdigitated combs are deposited on the surface of the layer 10 opposite to the receiver substrate 110 or, if need be, opposite to the final substrate (whether it is the receiver substrate 110 or the final substrate, the substrate forms the support substrate noted 11 in FIG. 2).

In the case where it is wished to produce a bulk acoustic wave device, an adaptation of the method described above has to be made. On the one hand, before the bonding step illustrated in FIG. 1B, a first electrode is deposited on the free surface of the layer 10 to transfer of the donor substrate, this first electrode (reference number 13 in FIG. 3) being buried in the final stack. After the transfer step illustrated in FIG. 1C, a second electrode (reference number 12 in FIG. 3) is deposited on the free surface of the layer 10, opposite to the first electrode. Another option is to transfer the layer 10 onto a final substrate as mentioned above and to form the electrodes before and after the transfer. On the other hand, to avoid the propagation of acoustic waves in the receiver substrate 110, it is possible to integrate therein an insulation means, for example, a Bragg mirror (as illustrated in FIG. 3) or a cavity etched beforehand in the receiver substrate or in the final substrate if need be.

Finally, it goes without saying that the examples that have been given are only particular illustrations that are in no way limiting with regard to the application fields of the disclosed method.

The invention claimed is:

1. A method for producing a layer of composition $AA'BO_3$ wherein an element A consists of at least one element selected from a group consisting of: Li, Na, K, Ca, Mg, Ba, Sr, Pb, La, Bi, Y, Dy, Gd, Tb, Ce, Pr, Nd, Sm, Eu, Ho, Zr, Sc, Ag, and Tl, and wherein an element B consists of at least one element selected from the group consisting of: Nb, Ta, Sb, Ti, Zr, Sn, Ru, Fe, V, Sc, C, Ga, Al, Si, Mn, and Tl, the method comprising:
   providing a donor substrate of composition $ABO_3$;
   forming a layer of composition $ABO_3$ by thinning the donor substrate; and
   before and/or after the thinning of the donor substrate, exposing the layer of composition $ABO_3$ to a medium containing ions of an element A' belonging to the same list of elements as the element A, the element A' being different from the element A, such that the ions of the element A' penetrate into the layer of composition $ABO_3$ to convert the entirety of the layer of composition $ABO_3$ into the layer of composition $AA'BO_3$, the layer of composition $AA'BO_3$ exhibiting a uniform composition.

2. The method of claim 1, wherein the ions of the element A' penetrate into the layer of composition $ABO_3$ by an ion exchange mechanism.

3. The method of claim 1, wherein the medium containing the ions of the element A' is a liquid and the layer of composition $ABO_3$ is immersed in a bath of the liquid.

4. The method of claim 1, wherein the layer of composition $ABO_3$ is immersed in a bath comprising an acid solution of a salt comprising the element A'.

5. The method of claim 1, wherein the medium containing the ions of the element A' is in gaseous phase and the layer of composition $ABO_3$ is exposed to the medium.

6. The method of claim 1, wherein the layer of composition $ABO_3$ is monocrystalline.

7. The method of claim 1, wherein the thickness of the layer of composition $ABO_3$ is greater than 2 µm, the layer of composition $ABO_3$ being self-supporting after the thinning of the donor substrate.

8. The method of claim 1, further comprising: producing a bulk acoustic wave device, the producing comprising forming electrodes on two opposite main faces of the layer of composition $AA'BO_3$, which comprises a piezoelectric layer.

9. The method of claim 1, further comprising: producing a surface acoustic wave device, the producing comprising forming two interdigitated electrodes on a surface of the layer of composition $AA'BO_3$, which comprises a piezoelectric layer.

10. The method of claim 1, wherein the medium containing the ions of the element A' is in solid phase, a layer of the medium being deposited on the layer of composition $ABO_3$.

11. The method of claim 10, further comprising at least one annealing step to cause diffusion of the element A' from the medium to the layer of composition $ABO_3$.

12. The method of claim 1, wherein the ions of the element A' penetrate into the layer of composition $ABO_3$ by implantation.

13. The method of claim 12, further comprising at least one heat treatment step for diffusing implanted ions into the layer of composition $ABO_3$.

14. The method of claim 1, wherein the element A is lithium and the element A' is sodium and/or potassium.

15. The method of claim 14, wherein the element B is niobium and/or tantalum.

16. The method of claim 1, wherein the thinning of the donor substrate comprises applying a receiver substrate on the donor substrate, the layer of composition $ABO_3$ being at an interface between the receiver substrate and the donor substrate, and transferring the layer of composition $ABO_3$ onto the receiver substrate.

17. The method of claim 16, wherein the application of the receiver substrate comprises deposition of the receiver substrate on the donor substrate.

18. The method of claim 16, wherein the application of the receiver substrate comprises bonding of the receiver substrate on the donor substrate.

19. The method of claim 16, wherein the thickness of the layer of composition $ABO_3$ is less than 20 µm.

20. The method of claim 16, wherein at least one electrically insulating layer and/or at least one electrically conducting layer is formed at an interface between the receiver substrate and the layer of composition $ABO_3$.

21. The method of claim 16, wherein the thinning of the donor substrate comprises:
   forming a weakened zone in the donor substrate so as to delineate the layer of composition $ABO_3$; and
   detaching the layer of composition $ABO_3$ from the donor substrate along the weakened zone.

22. The method of claim 21, wherein the weakened zone is formed by ion implantation in the donor substrate.

* * * * *

UNITED STATES PATENT AND TRADEMARK OFFICE
CERTIFICATE OF CORRECTION

PATENT NO. : 11,744,153 B2
APPLICATION NO. : 16/304063
DATED : August 29, 2023
INVENTOR(S) : Bruno Ghyselen It is certified that error appears in the above-identified patent and that said Letters Patent is hereby corrected as shown below:

In the Specification
Column 4, Line 29, change "1A to IF" to --1A to 1F--

Signed and Sealed this
Thirteenth Day of February, 2024

Katherine Kelly Vidal
*Director of the United States Patent and Trademark Office*